United States Patent [19]

Erhardt et al.

[11] Patent Number: 4,894,701
[45] Date of Patent: Jan. 16, 1990

[54] SEMICONDUCTOR DEVICE DETECTOR AND METHOD OF FORMING SAME

[75] Inventors: Harry G. Erhardt, Favetteville, N.Y.; Walter F. Kosonocky, Skillman, N.J.

[73] Assignee: General Electric Company, Schenectady, N.Y.

[21] Appl. No.: 192,043

[22] Filed: May 9, 1988

[51] Int. Cl.⁴ ............................................. H01L 27/14
[52] U.S. Cl. ........................................ 357/30; 357/24; 357/16
[58] Field of Search ................... 357/30 G, 30 Q, 24, 357/16, 24 LR

[56] References Cited

U.S. PATENT DOCUMENTS

| | | | |
|---|---|---|---|
| 3,968,272 | 7/1976 | Anand | 357/15 |
| 4,056,642 | 7/1976 | Saxena et al. | |
| 4,233,337 | 11/1980 | Friedman et al. | |
| 4,362,575 | 12/1982 | Wallace | |
| 4,608,749 | 9/1986 | Marada | 357/24 |
| 4,661,168 | 4/1987 | Maier | 357/24 |

OTHER PUBLICATIONS

Kimata et al., 1987 IEEE I.S.S.C., pp. 110-111.
Ishirara et al., 1980 IEEE I.S.S.C., pp. 24-25.
"A 512×512 Element PtSi Schottky-Barrier Infrared Image Sensor" by M. Kimata et al., 1987 IEEE International Solid State Circuits Conference, pp. 110-111.
"160×244 Element PtSi Schottky-Barrier IR-CCD Image Sensor" by W. F. Kosonocky et al., IEEE Transactions on Electron Devices, Vol. ED-32, No. 8, Aug. 1985.

Primary Examiner—Martin H. Edlow
Attorney, Agent, or Firm—Henry I. Steckler; James C. Davis, Jr.; Paul R. Webb, II

[57] ABSTRACT

A semiconductor device and method of making the device in which portions of the device may be completed prior to forming the detector region. The device comprises a substrate, a first insulating layer over the substrate, a first level semiconductor layer over the first insulating layer, a second insulating layer over the semiconductor layer, a metallic contact extending through the second insulating layer and a third insulating layer overlying the contact. A detector region is spaced apart from the contact. The method comprises the steps of forming a first insulating layer over the substrate, forming a semiconductor layer over the first insulating layer, forming a contact through the second insulating layer, forming a third insulating layer over the contact and forming an opening through the first, second and third insulating layers and forming a detector region in the opening.

7 Claims, 1 Drawing Sheet

SEMICONDUCTOR DEVICE DETECTOR AND METHOD OF FORMING SAME

The invention relates to a detector device, such as an infrared imaging array, in which charge coupled devices of the device may be completed prior to forming a detector region of the device.

BACKGROUND OF THE INVENTION

Detectors such as infrared sensing charge-coupled device (IR-CCD) imagers have been developed for sensing radiation. In particular, IR-CCDs typically incorporate Schottky-barrier detectors for sensing the infrared radiation and charge-coupled devices for transferring the detected signal from the detectors. One present construction of such an imager is described in the article of W. F. Kosonocky et al., entitled "160×244 Element PtSi Schottky-Barrier IR-CCD Image Sensor", IEEE Transactions on Electron Devices, Vol. ED-32, No. 8, August 1985. Improvements in detector fabrication have made other shortcomings, such as noisy (unsintered) metal contacts and pinholes in the insulating layers seem more pronounced. Therefore, it would be desirable to have a device and method in which charge coupled devices may be fabricated first and then presorted according to yield or operating characteristics and the detector may be formed thereafter. Such a technique is especially useful when one considers utilizing a foundry source for CCD's with the fabrication of detectors elsewhere. Additionally, improved contact reliability, increased accountability of the number of good devices at various stages, improved producibility, and greater physical protection of the device would be advantageous.

BRIEF DESCRIPTION OF THE DRAWINGS

The features of the invention are set forth with particularity in the appended claims. The invention itself, however, both as to organization and method of operation, together with further objects and advantages thereof, may best be understood by reference to the following description taken in conjunction with the accompanying drawings in which:

SUMMARY OF THE INVENTION

The invention provides a semiconductor device for detecting radiation and a method of forming the device. The device comprises a substrate having a major surface and a first insulating layer overlying a portion of the surface. A first level semiconductor layer overlies the first insulating layer and a second insulating layer overlies the first level semiconductor layer. A metallic contact extends through the second insulating layer and electrically contacts the semiconductor layer and a third insulating layer overlies the metalic contact. A detector region, which is spaced apart from the metallic contact, extends through the first, second and third insulating layers to the major surface.

The method comprises the steps of forming a first insulating layer over a substrate, forming a first level semiconductor layer over the first insulating layer and forming a second insulating layer over the semiconductor layer. A metallic contact is formed through the second insulating layer and electrically contacts the semiconductor layer and a third insulating layer is then formed over the metallic contact. An opening which is spaced apart from the metallic contact is then formed through the first, second and third insulating layers, and a detector region is formed in the opening.

Another method of forming the semiconductor device comprises the steps of forming an insulating layer over a surface of a substrate, forming a first level semiconductor layer over the insulating layer, forming a second insulating layer over the semiconductor layer, forming a metallic contact through the second insulating layer and forming a detector region after the step of forming the contact.

DETAILED DESCRIPTION OF PREFERRED EMBODIMENTS

Figure 1:
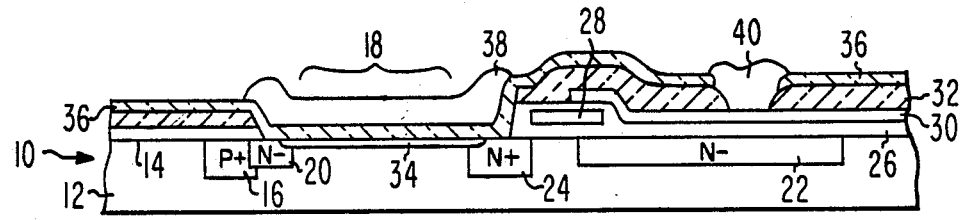
FIG. 1 is a section view illustrating a portion of a wafer of a previous semiconductor device detector.

In FIG. 1 a previous semiconductor device 10, such as an IR-CCD imager, comprises a substrate 12 having a major surface 14. Adjacent the surface 14 are N+ source and drain diffusions (not shown in the drawing), P+ channel stop diffusions 16 that isolate a detector region 18 from other detector regions; N− guard rings 20 that surround the channel stops 16 and help to reduce excess leakage current at the edge of the detector region 18; an N− channel region 22 that forms a buried channel CCD portion of the device 10 that reads the charge from the detector region 18; and an N+ region 24 that contacts the detector region 18 and facilitates the transfer of charge from the detector region 18 to the CCD device. A first insulating layer 26 overlies the surface 11 and a first level semiconductor layer 28, which serves as a gate, overlies or is positioned within the first insulating layer 26. A second level semiconductor layer 30, which also serves as a gate, overlies the first insulating layer 26, a second insulating layer 32 oerlies the first and second level semiconductor layers 28 and 30, respectively. The detector region 18 extends through the first and second insulating layers 26 and 32, respectively, and comprises a Schottky barrier formed of a metallic film 34 adjacent the surface 14. A dielectric region 36 typically overlies the metallic film 34 and the second insulating layer 32 and a reflective layer 38 typically overlies the dielectric region 36 to improve optical coupling. Metallic contacts 40 are also formed through the dielectric region 36 and the second insulating layer 32 to contact the first and second level semiconductor layers 28 and 32, respectively.

The preparation of the device 10 of FIG. 1 has previously been formed by techniques well known in the art. It should be understood that in fabricating this device the detector region 18 must be formed prior to completion of the CCD portion of the device. In particular, in the process of forming the Schottky barrier region 18 excess metal must be etched away. Therefore, the metallic contacts 40 must be formed after this step, to prevent the etchant from chemically attacking and dissolving the metallic contacts 40.

Figure 2:
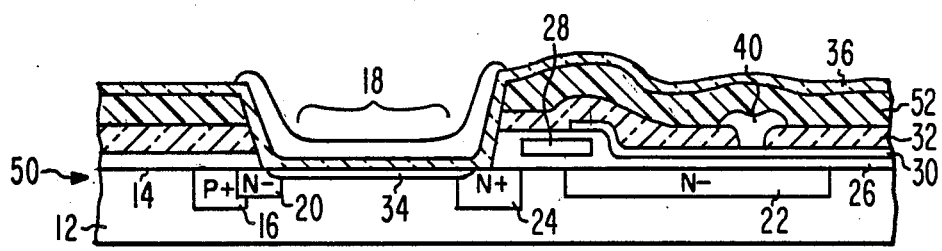
FIG. 2 is a section view illustrating a portion of a wafer of a semiconductor device of the present invention.

In FIG. 2 a semiconductor device 50 of the present invention is depicted in which the identification of common elements of the device 50 correspond to those of the device 10 in FIG. 1. In FIG. 2 a third insulating layer 52 overlies the metallic contacts 40. It should be noted that this third insulating layer does not extend over the reflector but instead is formed prior to defining the detector region 18. Therefore, the detector region 18 extends through the first, second and third insulating layers 26, 32 and 52, respectively.

The advantages of the present device structure are indicated in the method in which the device 50 is made. The wafer or substrate 12 is typically silicon doped with P-type atoms, such as boron, so as to have a uniform resistivity of between about 10 to 50 ohm-cm. The source and drain diffusions, P+ channel stop diffusions 16, N− guard rings 20, N− channel region 22 and N+ region are formed by techniques well known in the art such as described by Wallace in U.S. Pat. No. 4,362,575 entitled "Method of Making Buried Channel Charge Coupled Device with Means for Controlling Excess Charge", incorporated herein by reference. The first and second insulating layers 26 and 32, respectively are typically composed of silicon dioxide or boro-phosphosilicate glass and are formed by conventional thermal growth techniques. Typically the first insulating layer 26 comprises a first level insulating layer typically between about 500 and 1400 angstroms (Å) thick and a second level insulating layer between about 500 and 2200 Å thick The second insulating layer 32 is typically between about 5000 and 7000 Å thick. The first and second level semiconductor layers, 28 and 30 respectively, are typically composed of polysilicon about 7000 Å thick which is formed by conventional techniques such as chemical vapor deposition using silane and an inert gas. It should be understood that typically another insulating layer, such as the second level insulating layer, is formed over the first level semiconductor layer 28. However, prior to this the first level insulating layer may be partially etched away so that the second level semiconductor layer 30 is of similar distance above the substrate 12, as is well known to one of ordinary skill in the art. After the second insulating layer 32 is formed over the first and second level semiconductor layers 28 and 30 respectively, the device 50 may be annealed or densified at high temperature. This can be done in an inert forming gas including hydrogen or in hydrogen alone at a temperature of from about 400° C. to about 500° C. The metallic contacts 40 are then formed through the second insulating layer such as to contact the first and second level semiconductor layers, 28 and 30 respectively. Typically the contact openings are defined in accordance with known reflow glass techniques. Since detector contact holes are not open and silicides are not present, the CCD contact opening may be standardly reflowed to smooth the edges for better metal continuity. The metal contacts which are typically composed of aluminum or an aluminum alloy, such as one containing about 1 percent of silicon, are deposited in the contact openings by conventional techniques such as electron-beam or magnetron sputtering. The metallic contacts 40 are then sintered or annealed at a temperature of between about 400° C. to 500° C. and preferably about 450° C. It should be understood that the CCD portion of the device 50 is now completed. Therefore, wafers may be pretested and presorted according to yield or operating characteristics. Detector regions 18 may now be formed which may vary in design according to these characteristics and inadequate devices may be discarded without further device processing. Additionally, sintering of the contacts was not previously possible since the characteristics of the previously formed detector region 18 would be altered by subjecting the device 50 to these relatively high temperatures. This additional anneal helps to improve the metallic contact 40 reliability, reduces contact noise problems and also aids in reducing surface state density, thus improving device operation.

Figure 3:
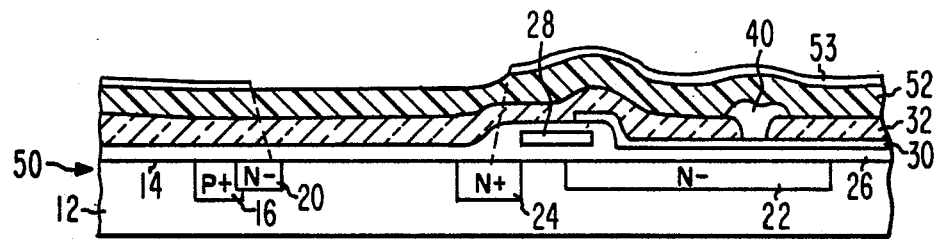
FIGS. 3 and 4 are section views illustrating a portion of the wafer at various steps in a method in accordance with this invention.

The third insulating layer 52 is then formed over the metallic contacts as shown in FIG. 3. The insulating layer may be any insulating layer of a suitable composition and thickness to protect the metallic contacts 40 and the device from reagents during subsequent processing. Preferably, a composition of silicon nitride deposited by low pressure chemical vapor deposition or other materials such as a parylene coating is used. Some materials such as silicon dioxide have thus far demonstrated an unacceptable pin-hole density such as to protect the device 50 during later processing.

Figure 4:
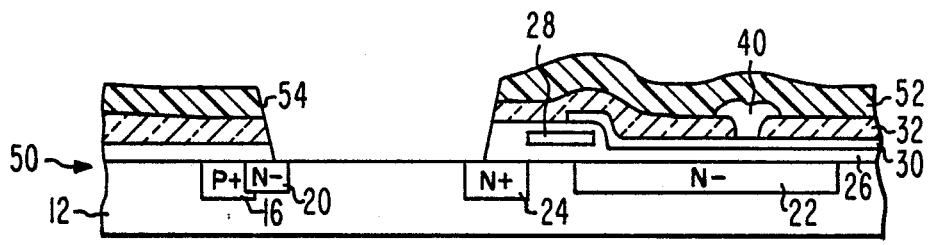

The detector region 18 is then formed by depositing a photoresist layer 53 as shown in FIG. 3 and then forming a detector opening 54 through the first, second and third insulating layers 26, 32 and 52, respectively, as shown in FIG. 4. The opening 54 is typically formed by conventional photolithographic and etching techniques such as by etching with a buffered hydrofluoric acid solution or other solutions suitable for etching silicon nitride or parylene. Preferably several final quenching steps are also used to inhibit the formation of sub-oxides on the surface 12 such as disclosed in U.S. Pat. Nos. 4,233,337 by Friedman et al.; 4,056,642 by Saxena et al. and 3,968,272 by Anand, all incorporated herein by reference.

To remove oxides which have formed subsequent to cleaning the wafer is preferably re-etched and the device 50 is placed in a protective ambient such as nitrogen. Immediately upon removal from the protective chamber the metal is deposited typically in an evacuation chamber at a pressure between about 2 to $7 \times 10^7$ torr. The substrate is then heated to a temperature between about 200° C. and 420° C. and more typically between about 280° C. and 380° C. A temperature of about 300° C. is preferably used for a platinum metallic film 34 and a temperature of 365° C. is used for a palladium metallic film 34. When the desired temperature is reached, metal vapor is introduced into the chamber. The metal then diffuses across any remaining surface oxide where it forms a continuous layer. Preferably the metal deposited is between about 10 to 30 Å thick and deposited at a rate of about 1 to 5 Å per second. Other deposition techniques such as electron beam deposition are equally applicable.

The device 50 is then annealed at a relatively low temperature at about 15 minutes and at 300° C. for platinum and for 2.5 hours at 365° C. for palladium. Cooling is typically at a rate of about 10° C. per minute. The wafer is then placed in an alloying furnace at a relatively low temperature, for example 320° C. which finishes forming a metal silicide film and the alloying time may vary from about 10 minutes to 16 hours in forming gas including at least 10% hydrogen. After alloying the excess metal is etched away. Platinum can be etched in an aqua regia dip at 95° C. for 1 and ½ minutes. The third insulating layer 52 protects the metallic contacts 40 during this etching operation. Further, because only the detector region 18 is defined, it may be possible to reduce the aqua regia etch time or temperature to reduce etch related defects. This etch process may also be substituted by using other processes, such as a lift off technique, which do not expose the metallic pattern and contacts 40 or at least minimizes etch related problems.

The dielectric region 36 may then be formed over the metal film 34 and the dielectric region 36 is typically between about 2000 to 8,000 Å thick. For a 8000 Å thick silicon dioxide layer the device 50 is typically placed in a chemical vapor deposition reactor and is heated to a temperature of about 340° C. to 375° C. Silane ($Si_4$) and oxygen ($O_2$) are fed into the reactor and react on the surface to form silicon dioxide ($SiO_2$). By depositing the dielectric region 36 at relatively low temperature, the device 50 is not affected by adverse high temperature. After the dielectric region 36 is formed, the reflective layer 38 is deposited over it in accordance with generally conventional metallization techniques and mask and etch procedures. Contact openings are then formed to expose the CCD metallization to expose pads for electrical wirebonding which completes the process.

The present device and method of making the device provides that one portion of the device is completed prior to forming the remaining device. In particular, CCDs may be pretested, evaluated and presorted according to operating characteristics. Detector regions may then be formed without affecting the CCD performance. For example, the thickness or the composition of the dielectric region may be mor easily varied, to facilitate detector cavities tuned for different wavelenghts, since the interconnect metal is already completed and step coverage is no longer a concern. Further, the additional insulating layers are advantageous to physically protect the device.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

We claim:

1. A semiconductor device for detecting radiation comprising:
    a substrate having a major surface;
    a first insulating layer overlying a portion of said surface;
    a first level semiconductor layer disposed completely within said first insulating layer;
    a second insulating layer overlying said first level semiconductor layer;
    a first metallic contact which extends through said second insulating layer and electrically contacts said first level semiconductor layer;
    a third insulating layer overlying said metallic contact; and
    a detector region which is spaced apart from said metallic contact and said detector region extends through said first, second and third insulating layers to said major surface.

2. The device of claim 1 wherein said device is an infrared sensing detector having charge-coupled devices therein.

3. The device of claim 2 wherein said detector region comprises a Schottky-barrier detector.

4. The device of claim 3 wherein said third insulating layer comprises silicon nitride.

5. The device of claim 3 wherein said second level semiconductor layer overlies said first insulating layer and a second metallic contact extends through said second insulating layer and electrically contact said second level semiconductor layer, and said third insulating layer overlies said second metallic contact.

6. The device of claim 3 wherein said detector region comprises a metal silicide film, a dielectric region overlying said metal silicide film and a reflective layer overlying said dielectric region.

7. The device of claim 3 wherein said metallic contact is composed of aluminum or an aluminum alloy.

* * * * *